(12) United States Patent
Lei

(10) Patent No.: US 9,979,883 B2
(45) Date of Patent: May 22, 2018

(54) IMAGING METHOD FOR IMAGE SENSOR, IMAGING APPARATUS, AND ELECTRONIC DEVICE

(71) Applicant: GUANGDONG OPPO MOBILE TELECOMMUNICATIONS CORP., LTD., Dongguan (CN)

(72) Inventor: Hui Lei, Dongguan (CN)

(73) Assignee: Guangdong Oppo Telecommunications Corp., Ltd., Dongguan, Guangdong (CN)

( * ) Notice: Subject to any disclaimer, the term of this patent is extended or adjusted under 35 U.S.C. 154(b) by 0 days. days.

(21) Appl. No.: 15/823,358

(22) Filed: Nov. 27, 2017

(65) Prior Publication Data
US 2018/0077349 A1 Mar. 15, 2018

Related U.S. Application Data

(63) Continuation of application No. 15/546,490, filed as application No. PCT/CN2016/100649 on Sep. 28, 2016.

(30) Foreign Application Priority Data

Dec. 18, 2015 (CN) .......................... 2015 1 0963341

(51) Int. Cl.
H04N 3/14 (2006.01)
H04N 5/335 (2011.01)
(Continued)

(52) U.S. Cl.
CPC ... *H04N 5/23232* (2013.01); *H01L 27/14621* (2013.01); *H01L 27/14627* (2013.01);
(Continued)

(58) Field of Classification Search
CPC .......... H04N 5/23238; H04N 5/23232; H04N 5/23235; H04N 5/23229; H04N 5/3415; H04N 5/343; H04N 3/1593
See application file for complete search history.

(56) References Cited

U.S. PATENT DOCUMENTS 6,999,119 B1 * 2/2006 Shibazaki .............. H04N 9/045
348/230.1
7,745,779 B2 * 6/2010 Conners ............... H04N 5/2351
250/208.1
(Continued)

FOREIGN PATENT DOCUMENTS

CN 102457683 A 5/2012
CN 103067660 A 4/2013
(Continued)

OTHER PUBLICATIONS

Chinese Patent Application No. CN201510963341.3 First Office action dated Mar. 9, 2017, with English translation, 15 pages.
(Continued)

Primary Examiner — Kelly L Jerabek
(74) Attorney, Agent, or Firm — Lathrop Gage LLP

(57) ABSTRACT

The present disclosure provides an imaging method for an image sensor, an imaging apparatus and an electronic device. The image sensor includes a photosensitive pixel array and a filter arranged on the photosensitive pixel array. The filter includes an array of filter units. Each filter unit and a number of adjacent photosensitive pixels covered by the filter unit in the photosensitive pixel array form a synthesized pixel. The method includes: reading an output of the photosensitive pixel array, extracting pixel values of photosensitive pixels within different synthesized pixels from a read-out single-frame high-resolution image, and combining the pixel values so as to obtain a number of multi-frame
(Continued)

low-resolution images; synthesizing the number of multi-frame low-resolution images.

7 Claims, 5 Drawing Sheets

(51) Int. Cl.
  *H04N 9/04*      (2006.01)
  *H04N 5/232*     (2006.01)
  *H01L 27/146*    (2006.01)
  *H04N 9/07*      (2006.01)

(52) U.S. Cl.
  CPC ....... *H01L 27/14645* (2013.01); *H04N 9/045* (2013.01); *H04N 9/07* (2013.01); *H01L 27/14618* (2013.01)

(56) References Cited

U.S. PATENT DOCUMENTS

| | | |
|---|---|---|
| 2007/0025718 A1 | 2/2007 | Mori et al. |
| 2008/0130991 A1 | 6/2008 | O'Brien et al. |
| 2011/0052095 A1 | 3/2011 | Deever |
| 2012/0113303 A1* | 5/2012 | Choe .................. H04N 5/23232 348/273 |
| 2012/0147205 A1* | 6/2012 | Lelescu .............. H04N 13/0029 348/218.1 |
| 2014/0192250 A1 | 7/2014 | Mitsunaga |
| 2014/0267243 A1* | 9/2014 | Venkataraman ...... G06T 7/0065 345/419 |
| 2014/0267351 A1 | 9/2014 | Klaus et al. |
| 2014/0267890 A1* | 9/2014 | Lelescu .................. H04N 9/045 348/373 |
| 2015/0288861 A1* | 10/2015 | Duparre ............... H04N 5/3696 348/218.1 |
| 2015/0312537 A1 | 10/2015 | Solhusvik et al. |
| 2015/0350583 A1 | 12/2015 | Mauritzson et al. |
| 2016/0014354 A1* | 1/2016 | Fukuda .................. H04N 5/349 348/273 |

FOREIGN PATENT DOCUMENTS

| | | |
|---|---|---|
| CN | 103531603 A | 1/2014 |
| CN | 103681721 A | 3/2014 |
| CN | 103686007 A | 3/2014 |
| CN | 103716558 A | 4/2014 |
| CN | 104159049 A | 11/2014 |
| CN | 105516698 A | 4/2016 |
| CN | 105516700 A | 4/2016 |
| CN | 105578005 A | 5/2016 |
| CN | 105578071 A | 5/2016 |
| JP | 2004282552 A | 10/2004 |
| JP | 2006311240 A | 11/2006 |
| WO | WO 2014065056 A1 | 5/2014 |

OTHER PUBLICATIONS

Chinese Patent Application No. CN201510963341.3 Second Office action dated Apr. 28, 2017, with English translation, 16 pages.
Chinese Patent Application No. CN201510963341.3 Third Office action dated Jun. 29, 2017, with English translation, 7 pages.
Chinese Patent Application No. CN201510963341.3 Fourth Office action dated Sep. 4, 2017, with English translation, 10 pages.
Chinese Patent Application No. CN201510963341.3 Notification to Grant Patent Right for Invention, with English translation, dated Oct. 25, 2017, 3 pages.
Chinese Patent Application No. CN201510963341.3 English translation of claims dated Oct. 25, 2017 2 pages.
PCT/CN2016/100649 English translation of the International Search Report dated Nov. 30, 2016, 3 pages.
PCT/CN2016/100649 International Search Report & Written Opinion dated Nov. 30, 2016, 13 pages.
Singapore Patent Application No. 11201705233R Search and Opinion dated Dec. 18, 2017, 7 pages.
European Patent Application No. 16874615.4 extended Search and Opinion dated Nov. 16, 2017, 7 pages.
Japanese Patent Application No. 2017534320 Office Action dated Nov. 28, 2017, 3 pages.

* cited by examiner

IMAGING METHOD FOR IMAGE SENSOR, IMAGING APPARATUS, AND ELECTRONIC DEVICE

CROSS REFERENCE TO RELATED APPLICATIONS

This application is a continuation application of a U.S. application Ser. No. 15/546,490 filed Jul. 26, 2017, which is a U.S. national phase application of International Application No. PCT/CN2016/100649, filed on Sep. 28, 2016, which claims a priority to Chinese Patent Application Serial No. 201510963341.3, filed with the State Intellectual Property Office of P. R. China on Dec. 18, 2015 by GUANGDONG OPPO MOBILE TELECOMMUNICATIONS CORP., LTD., and titled with "imaging method for image sensor, imaging apparatus and electronic device", the entire contents of which are incorporated herein by reference.

TECHNICAL FIELD

The present disclosure relates to the imaging technology field, and more particularly, to an imaging method for an image sensor, an imaging apparatus and an electronic device.

BACKGROUND

At present, diversification of camera functions of mobile phones has earned trust of users. Multi-frame synthesis technology is applied in many mobile phones when photographing, i.e. an image sensor of the mobile phone continuously captures a plurality of images, and then the images are synthesized by software so as to achieve different photography effects (such as a High Dynamic Range (HDR for short) effect, a night effect, etc.) to enrich use experience.

However, in the multi-frame synthesis technology used in related art, due to a need of acquiring the multi-frame data, long time is required for the multi-frame data. In addition, if an object to be photographed is moving when capturing the multi-frame data, ghosting effect occurs easily after synthesis.

SUMMARY

The present disclosure aims to solve at least one of the problems in related art to some extent. Accordingly, a first objective of the present disclosure is to provide an imaging method for an image sensor.

A second objective of the present disclosure is to provide an imaging apparatus.

A third objective of the present disclosure is to provide an electronic device.

A fourth objective of the present disclosure is to provide a mobile terminal.

A fifth objective of the present disclosure is to provide a non-transitory computer-readable storage medium.

In order to achieve the above objectives, a first aspect of embodiments of the present disclosure provides an imaging method for an image sensor. The image sensor includes a photosensitive pixel array and a filter arranged on the photosensitive pixel array. The filter includes an array of filter units. Each filter unit and 2*2 adjacent photosensitive pixels covered by the filter unit in the photosensitive pixel array form a synthesized pixel. Four adjacent synthesized pixels corporately form a synthesized pixel unit. Four filter units arranged adjacently within each synthesized pixel unit comprise a red filter unit, a blue filter unit and two green filter units. Each photosensitive pixel comprises a photodiode, and one photosensitive pixel corresponds to one source follower and one analog-to-digital converter. The imaging method includes: reading an output of the photosensitive pixel array, and extracting pixel values of photosensitive pixels located at same positions or different locations in four adjacent synthesized pixels of the synthesized pixel unit from a read-out single-frame high-resolution image, and combining the pixel values so as to obtain four frames of low-resolution images; and synthesizing the four frames of low-resolution images.

A second aspect of embodiments of the present disclosure provides an imaging apparatus including an image sensor and an imaging processing module. The image sensor includes a photosensitive pixel array; a filter arranged on the photosensitive pixel array, the filter includes an array of filter units, each filter unit and 2*2 adjacent photosensitive pixels covered by the filter unit in the photosensitive pixel array form a synthesized pixel. Four adjacent synthesized pixels corporately form a synthesized pixel unit. Four filter units arranged adjacently within each synthesized pixel unit comprise a red filter unit, a blue filter unit and two green filter units. Each photosensitive pixel comprises a photodiode, and one photosensitive pixel corresponds to one source follower and one analog-to-digital converter. The image processing module is connected to the image sensor, the imaging processing module is configured to read an output of the photosensitive pixel array, and to extract pixel values of photosensitive pixels located at same positions or different locations in four adjacent synthesized pixels of the synthesized pixel unit from a read-out single-frame high-resolution image, and is configured to combine the pixel values so as to obtain four frames of low-resolution images, and is configured to synthesize the four frames of low-resolution images.

A third aspect of embodiments of the present disclosure provides an electronic device. The electronic device includes the imaging apparatus according to the second aspect of embodiments of the present disclosure.

A fourth aspect of embodiments of the present disclosure provides a mobile terminal. The mobile terminal includes a housing; a processor; a memory; a circuit board; a power supply circuit and an image sensor. The circuit board is located in a space defined by the housing. The processor, the memory and the image sensor are arranged on the circuit board. The power supply circuit is configured to supply power for each circuit or component in the mobile terminal. The image sensor includes a photosensitive pixel array and a filter arranged on the photosensitive pixel array. The filter includes an array of filter units. Each filter unit and a plurality of adjacent photosensitive pixels covered by the filter unit in the photosensitive pixel array form a synthesized pixel. The memory is configured to store executable program codes. The processor is configured to run a program corresponding to the executable program codes by executing the executable program codes stored in the memory so as to perform the following steps: reading an output of the photosensitive pixel array, extracting pixel values of photosensitive pixels within different synthesized pixels from a read-out single-frame high-resolution image, and combining the pixel values so as to obtain a plurality of multiple-frame low-resolution images; and synthesizing the plurality of multiple-frame low-resolution images.

A fifth aspect of embodiments of the present disclosure provides a non-volatile computer storage medium having one or more programs stored therein. When one or more programs are executed by a device, the device can be configured to perform the imaging method for an image sensor according to the first aspect of embodiments of the present disclosure.

DETAILED DESCRIPTION

Figure 1A:
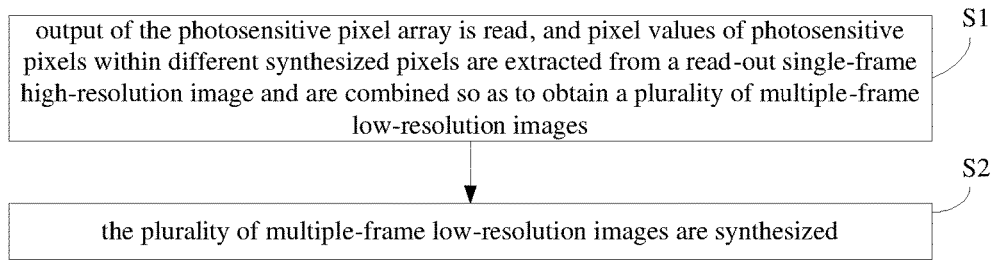
FIG. 1A is a flow chart showing an imaging method for an image sensor according to an embodiment of the present disclosure.

Reference will now be made in detail to embodiments of the present disclosure. Embodiments of the present disclosure will be shown in drawings, in which the same or similar elements and the elements having same or similar functions are denoted by like reference numerals throughout the descriptions. The embodiments described herein according to drawings are explanatory and illustrative and used to generally understand the present disclosure. The embodiments shall not be construed to limit the present disclosure.

In the following, an imaging method for an image sensor, an imaging apparatus and an electronic device according to embodiments of the present disclosure will be described with reference to the drawings.

FIG. 1A is a flow chart showing an imaging method for an image sensor according to an embodiment of the present disclosure.

First, the image sensor used in the method of an embodiment of the present disclosure will be described.

In detail, the image sensor includes a photosensitive pixel array and a filter disposed on the photosensitive pixel array. The filter includes an array of filter units. The array of filter units includes a plurality of filter units. Each filter unit and a plurality of adjacent photosensitive pixels covered by the filter unit in the photosensitive pixel array form a synthesized pixel.

In an embodiment of the present disclosure, four adjacent synthesized pixels corporately form a synthesized pixel unit. Four filter units arranged adjacently within each synthesized pixel unit include a red filter unit, a blue filter unit and two green filter units.

Figure 2:
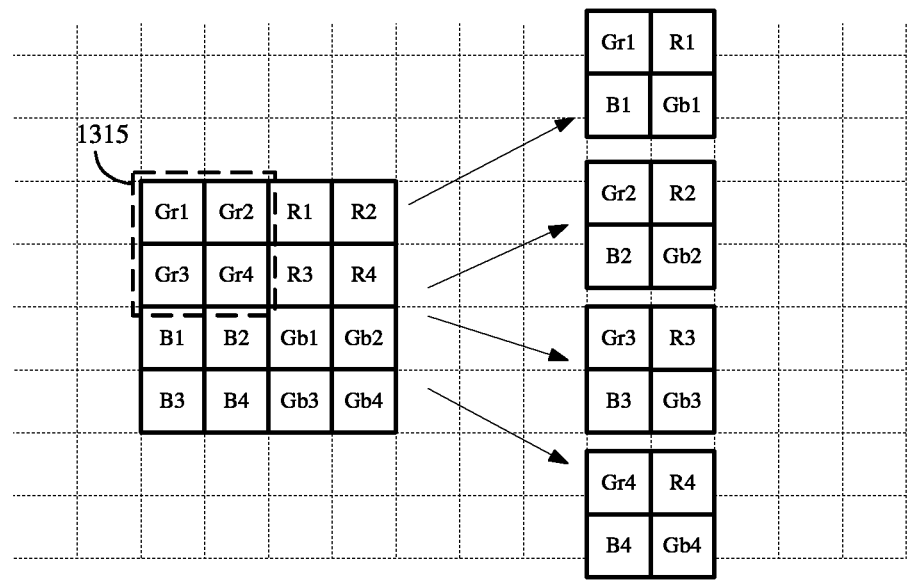
FIG. 2 is a schematic diagram illustrating the obtaining of a plurality of low-resolution image frames according to a specific embodiment of the present disclosure.
Figure 4A:
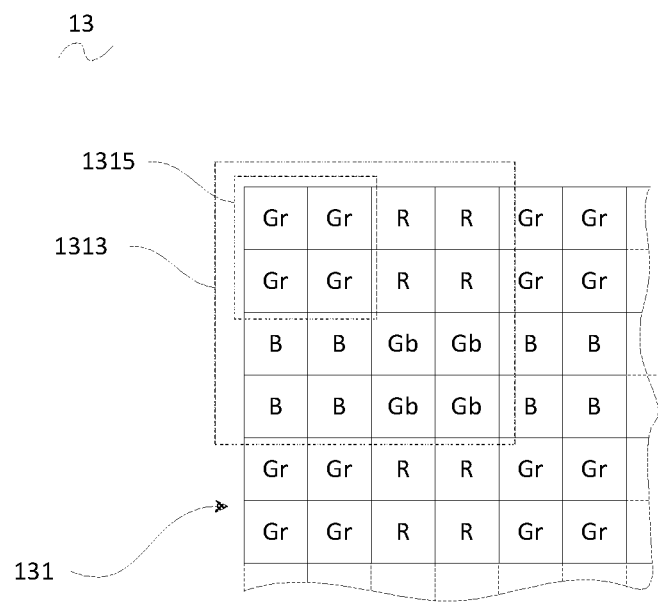
FIG. 4A is a schematic diagram illustrating an array of filter units according to an embodiment of the present disclosure.
Figure 4B:
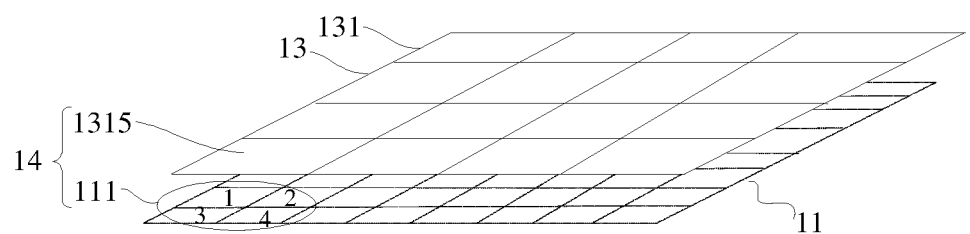
FIG. 4B is a schematic diagram illustrating a structure of an image sensor according to an embodiment of the present disclosure.

Referring to FIGS. 2 and 4B, each filter unit 1315 and four adjacent photosensitive pixels 111 covered by this filter unit 1315 in the photosensitive pixel array 11 form a synthesized pixel 14. The four adjacent synthesized pixels form a synthesized pixel unit including sixteen photosensitive pixels 111.

The four adjacent photosensitive pixels 111 share a filter unit 1315 of the same color. For example, the four adjacent photosensitive pixels Gr1, Gr2, Gr3 and Gr4 in a dashed box illustrated in FIG. 2 correspond to the green filter unit 1315. In FIG. 2, Gr, R, B, and Gb are configured to indicate colors of the filter units 1315 respectively. The numerals 1, 2, 3, 4 are configured to indicate positions of the four adjacent photosensitive pixels 111 beneath the filter unit 1315. In detail, R is configured for indicating the red filter unit 1315. B is configured for indicating the blue filter unit 1315. Gr and Gb are configured for indicating the green filter unit 1315 respectively.

The filter unit 1315 shared by the four adjacent photosensitive pixels 111 may be integrally formed, or assembled from four individual filters. Preferably, the filter unit 1315 in this embodiment of the present disclosure is integrally formed.

Referring again to FIG. 1A, an imaging method for an image sensor according to an embodiment of the present disclosure may include the following.

S1, output of the photosensitive pixel array is read, and pixel values of photosensitive pixels within different synthesized pixels are extracted from a read-out single-frame high-resolution image and are combined so as to obtain a plurality of multiple-frame low-resolution images.

In an embodiment of the present disclosure, extracting pixel values of photosensitive pixels within different synthesized pixels from a read-out single-frame high-resolution image, and combining the pixel values so as to obtain a plurality of multiple-frame low-resolution images includes: extracting the pixel values of the photosensitive pixels located at same positions in the different synthesized pixels from the read-out single-frame high-resolution image, and combining the pixel values so as to obtain the plurality of multiple-frame low-resolution images.

It is to be understood that, the position where the pixel is extracted from the single-frame high-resolution image in an embodiment of the present disclosure can also be adjusted according to actual requirements for synthesizing images, such as extracting the pixel values of the photosensitive pixels located at different positions relative to their respective synthesized pixels from the read-out single-frame high-resolution image, and combining the pixel values so as to obtain the plurality of multiple-frame low-resolution images.

Referring to FIGS. 2 and 4B, the pixel values of the photosensitive pixels 111 located at same positions in the different synthesized pixels 14 (four different synthesized pixels) are extracted from the single-frame high-resolution image and then are synthesized so as to obtain four frames of low-resolution images. For example, the four photosensitive pixels 111 in the first frame of the obtained low-resolution images are extracted from the pixel values of the photosensitive pixels 111 located at the same positions Gr1, R1, B1 and Gb1 relative to four respective filter units 1315 included in the four adjacent synthesized pixels 14.

S2, the plurality of multiple-frame low-resolution images are synthesized.

In an embodiment, the plurality of multiple-frame low-resolution images acquired are synthesized to generate an HDR (High dynamic range) image.

With the imaging method according to an embodiment of the present disclosure, an HDR image can be obtained by synthesis as long as there is one frame output from the image sensor, thereby greatly reducing the time period for waiting for data frames during the multi-frame synthesis. Moreover, since the data for the multi-frame synthesis comes from the same frame output of the image sensor, the generation of ghosting is avoided, thereby greatly enhancing the user experience.

Figure 1B:
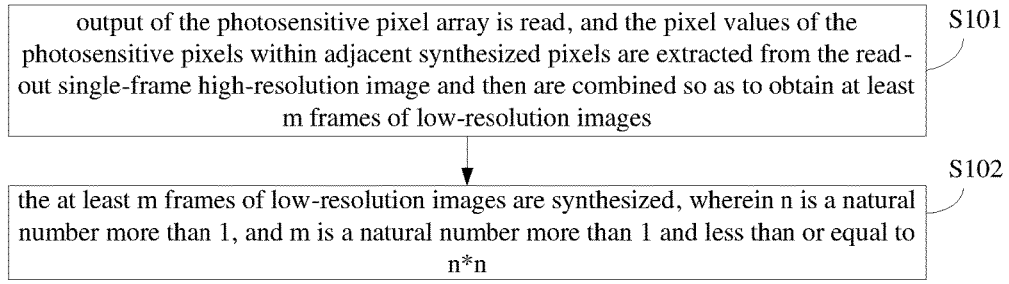
FIG. 1B is a flow chart showing an imaging method for an image sensor according to a specific embodiment of the present disclosure.

In a specific embodiment of the present disclosure, each filter unit together with n*n adjacent photosensitive pixels covered by the filter unit in the photosensitive pixel array form a synthesized pixel. As illustrated in FIG. 1B, the imaging method for an image sensor can include the following.

S101, output of the photosensitive pixel array is read, and the pixel values of the photosensitive pixels within adjacent synthesized pixels are extracted from the read-out single-frame high-resolution image and then are combined so as to obtain at least m frames of low-resolution images.

S102, the at least m frames of low-resolution images are synthesized, wherein n is a natural number more than 1, and m is a natural number more than 1 and less than or equal to n*n.

In detail, since a synthesized pixel includes n*n photosensitive pixels, at most n*n frames of low-resolution images can be obtained by extracting the pixel values of the photosensitive pixels within different synthesized pixels from the read-out single-frame high-resolution image, and combining the pixel values. According to actual needs, the at least m frames of low-resolution images can be obtained for multi-frame synthesis.

Figure 1C:
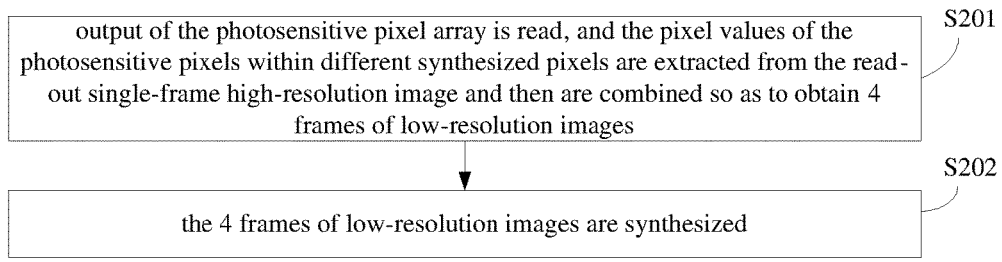
FIG. 1C is a flow chart showing an imaging method for an image sensor according to a specific embodiment of the present disclosure.

In a specific embodiment of the present disclosure, each filter unit and 2*2 adjacent photosensitive pixels covered by the filter unit in the photosensitive pixel array form a synthesized pixel. As illustrated in FIG. 1C, the imaging method for an image sensor can include the following.

S201, output of the photosensitive pixel array is read, and the pixel values of the photosensitive pixels within different synthesized pixels are extracted from the read-out single-frame high-resolution image and then are combined so as to obtain 4 frames of low-resolution images.

S202, the 4 frames of low-resolution images are synthesized.

For example, it is assumed that the frame rate of an image sensor with 16M pixels at dark is 8 frames per second. If 4 frames of data are used for multi-frame synthesis, then in the multi-frame synthesis of the related art, 4 frames of data are required to be output by the image sensor, that is, the time period for waiting for the data frames during the multi-frame synthesis is 0.5 seconds; however, in the imaging method for an image sensor of embodiments of the present disclosure, only one frame of data outputted from the image sensor is required, and then the one frame of data can be divided into four 4M images by extracting the pixel values of the photosensitive pixels within different synthesized pixels from this read-out high-resolution image frame, and by combining the pixel values, that is, the time period of waiting for the data frame during the multi-frame synthesis is only 0.125 s, thereby greatly reducing the time period of waiting for the data frame during the multi-frame synthesis and giving a user a better camera experience.

In addition, when the four frames of low-resolution images are synthesized, since these four 4M images are divided from the same frame image of the image sensor, the difference among the four 4M images is small, so that the possibility of ghosting effect can be reduced.

It is to be understood that, concerning the structure of the plurality of photosensitive pixels covered by each filter unit, in addition to the structure of n*n (for example, 2*2, 3*3, 4*4) photosensitive pixels, there may be the structure of any n*m (n and m are the natural numbers respectively) photosensitive pixels. Since the number of photosensitive pixels arranged on the photosensitive pixel array is limited, if each filter unit covers too many photosensitive pixels, the resolution of the low-resolution image obtained is limited. For example, when the pixel value of the photosensitive pixel array is 16M, if the structure of 2*2 photosensitive pixels is used, four low-resolution images each of which has the resolution of 4M are obtained, and if the structure of 4*4 photosensitive pixels is used, sixteen low-resolution images each of which has the resolution of 1M are obtained. Therefore, the structure of 2*2 photosensitive pixels is a better arrangement, which can enhance brightness and sharpness of the image under the premise of sacrificing less resolution as possible.

In an embodiment of the present disclosure, the image sensor further includes a lens array arranged above the filter units. The lens array includes a plurality of micro-lenses. Each micro-lens arranged corresponds to one photosensitive pixel. The lens array converges light onto photosensitive parts of photosensitive pixels beneath the filter, thereby enhancing the photosensitivity of the photosensitive pixels to improve the quality of the image.

In order to realize the above embodiments, the present disclosure also provides an imaging apparatus.

Figure 3:
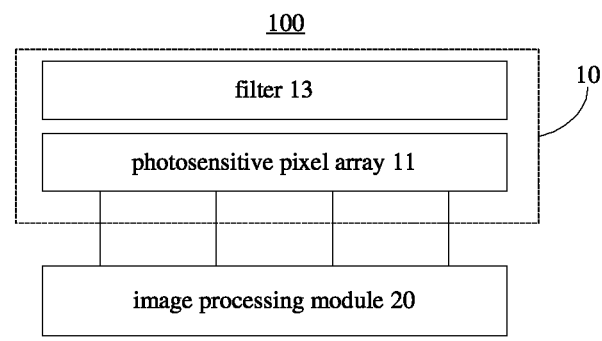
FIG. 3 is a block diagram showing an imaging apparatus according to an embodiment of the present disclosure.

FIG. 3 is a block diagram showing an imaging apparatus according to an embodiment of the present disclosure. As illustrated in FIG. 3, the imaging apparatus 100 according to an embodiment of the present disclosure includes an image sensor 10 and an image processing module 20 connected to the image sensor 10.

Referring to FIGS. 4A and 4B, the image sensor 10 includes a photosensitive pixel array 11 and a filter 13 arranged on the photosensitive pixel array 11. The filter 13 includes an array of filter units 131. The array of filter units 131 includes a plurality of filter units 1315. Each filter unit 1315 and a plurality of adjacent photosensitive pixels 111 arranged under the filter unit 1315 form a synthesized pixel 14. In an embodiment of the present disclosure, four adjacent synthesized pixels 14 corporately form a synthesized pixel unit (not illustrated in the drawings). The plurality of filter units 1315 arranged adjacently within each synthesized pixel unit include a red filter unit 1315, a blue filter unit 1315 and two green filter units 1315.

Taking each filter unit 1315 covering the four adjacent photosensitive pixels 111 with the serial numbers 1, 2, 3 and 4 in the photosensitive pixel array 11 as an example, as illustrated in FIG. 4B, each filter unit 1315 and four adjacent photosensitive pixels 111 arranged under this filter unit 1315 form a synthesized pixel 14. The four adjacent synthesized pixels 14 corporately form a synthesized pixel unit including sixteen photosensitive pixels 111.

The four adjacent photosensitive pixels 111 share a filter unit 1315 of the same color. The four adjacent filter units 1315 (including a red filter unit 1315, a blue filter unit 1315 and two green filter units 1315) form a filter structure 1313.

The filter unit 1315 shared by the four adjacent photosensitive pixels 111 may be integrally formed or assembled from four separate filters. Preferably, the filter unit 1315 shared by four adjacent photosensitive pixels 111 is integrally formed (referring to FIG. 4B).

The image processing module 20 is configured to read an output of the photosensitive pixel array 11, and is configured to extract pixel values of photosensitive pixels 111 within different synthesized pixels from a read-out single-frame high-resolution image, and combine the pixel values so as to obtain a plurality of multiple-frame low-resolution images, and is configured to synthesize the plurality of multiple-frame low-resolution images.

In an embodiment of the present disclosure, the image processing module 20 is further configured to extract the pixel values of the photosensitive pixels 111 located at same positions in the different synthesized pixels from the read-out single-frame high-resolution image, and is further configured to combine the pixel values so as to obtain the plurality of multiple-frame low-resolution images.

It is to be understood that, the position where the pixel is extracted from the single-frame high-resolution image in an embodiment of the present disclosure can also be adjusted according to actual requirements of the composite image, such as the image processing module 20 extracts the pixel values of the photosensitive pixels located at different positions in the different synthesized pixels from the read-out single-frame high-resolution for combination so as to obtain the plurality of multiple-frame low-resolution images.

Referring to FIGS. 2 and 4B, the image processing module 20 extracts the pixel values of the photosensitive pixels 111 located at same positions in the different synthesized pixels 14 (four different synthesized pixels including the photosensitive pixels 111) from the single-frame high-resolution image, and then combines the pixel values so as to obtain 4 frames of low-resolution images. For example, the four photosensitive pixels 111 in the first frame of the obtained low-resolution images are extracted from the pixel values of the photosensitive pixels 111 located at same positions Gr1, R1, B1 and Gb1 relative to four respective filter units 1315 included in the four adjacent synthesized pixels 14.

Further, the image processing module 20 is configured to synthesize the plurality of multiple-frame low-resolution images acquired to synthesize an HDR image.

With the imaging apparatus according to an embodiment of the present disclosure, the image processing module can obtain an HDR image by synthesis as long as there is one frame outputted from the image sensor, thereby greatly reducing the time period for waiting for data frames during the multi-frame synthesis; further since the data for the multi-frame synthesis comes from the same frame of the image sensor, the ghosting effect may be avoided, and thus greatly enhancing the user experience.

In an embodiment of the present disclosure, each filter unit 1315 and n*n adjacent photosensitive pixels 111 covered by the filter unit 1315 in the photosensitive pixel array 11 form a synthesized pixel. The image processing module 20 is further configured to: read output of the photosensitive pixel array 111, extract the pixel values of the photosensitive pixels 111 within adjacent synthesized pixels from the read-out single-frame high-resolution image, and combine the pixel values so as to obtain at least m frames of low-resolution images, and synthesize the at least m frames of low-resolution images, wherein n is a natural number more than 1, m is a natural number more than 1 and less than or equal to n*n.

In an embodiment of the present disclosure, each filter unit 1315 and 2*2 adjacent photosensitive pixels 111 covered by the filter unit 1315 in the photosensitive pixel array 11 form a synthesized pixel. The image processing module 20 is further configured to: read output of the photosensitive pixel array 11, extract the pixel values of the photosensitive pixels 111 within different synthesized pixels from the read-out single-frame high-resolution image, and combine the pixel values so as to obtain 4 frames of low-resolution images, and synthesize the 4 frames of low-resolution images.

For example, it is assumed that the frame rate of a 16M image sensor at dark is 8 frames per second. If 4 frames of data are used for multi-frame synthesis, then in the multi-frame synthesis of the related art, 4 frames of data are required to be outputted by the image sensor, that is, the time period for waiting for the data frames during the multi-frame synthesis is 0.5 seconds; however, according to the imaging apparatus in embodiments of the present disclosure, only one frame of data outputted from the image sensor is required, and then the image processing module 20 extracts the pixel values of the photosensitive pixels 111 within different synthesized pixels from this frame read-out high-resolution image and combines the pixel values, such that the one frame of data can be divided into four 4M images, that is, the time period of waiting for the data frame during the multi-frame synthesis is only 0.125 s, thereby greatly reducing the time period of waiting for the data frame during the multi-frame synthesis and giving a user a better camera experience.

In addition, when the 4 frames of low-resolution images are synthesized, since four 4M images are divided from the same image frame of the image sensor, the difference among the four 4M images is small, so that the possibility of ghosting effect can be reduced.

It is to be understood that, concerning the structure of the plurality of photosensitive pixels 111 covered by each filter unit 1315, in addition to the structure of n*n (for example, 2*2, 3*3, 4*4) photosensitive pixels, there may be the structure of any n*m (n and m are the natural numbers respectively) photosensitive pixels. Since the number of photosensitive pixels 111 arranged on the photosensitive pixel array 11 is limited, if each filter unit 1315 covers too many photosensitive pixels 111, the resolution of the low-resolution image obtained is limited. For example, when the pixel value of the photosensitive pixel array 11 is 16M, if the structure of 2*2 photosensitive pixels is used, four low-resolution images each of which has the resolution of 4M are obtained, and if the structure of 4*4 photosensitive pixels is used, sixteen low-resolution images each of which has the resolution of 1M are obtained. Therefore, the structure of 2*2 photosensitive pixels is a better arrangement, which can enhance brightness and sharpness of the image under the premise of sacrificing less resolution as possible.

Figure 4C:
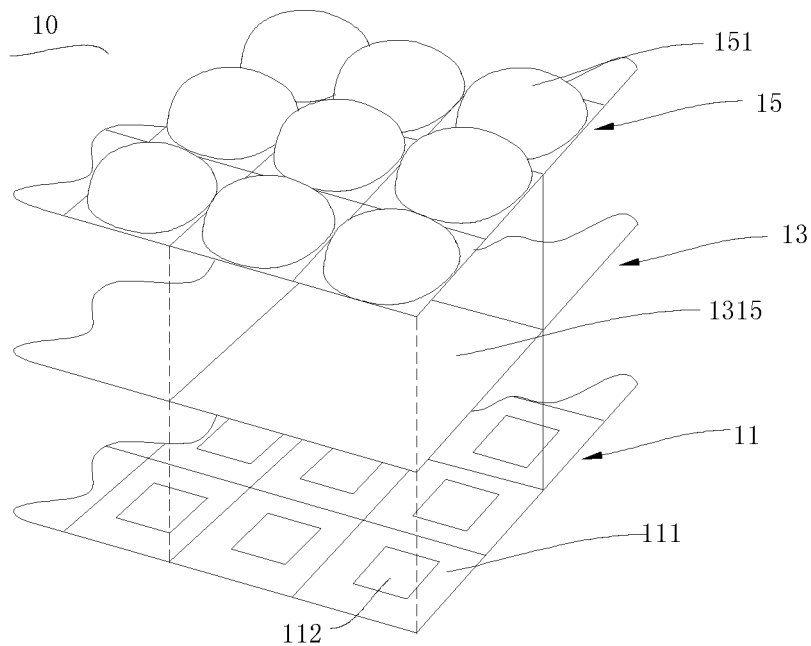
FIG. 4C is a schematic diagram illustrating a structure of an image sensor according to another embodiment of the present disclosure.

Referring to FIG. 4C, in an embodiment of the present disclosure, each synthesized pixel 14 of the image sensor 10 further includes a lens array 15 arranged above the filter units 1315. Each micro-lens 151 in the lens array 15 corresponds to one photosensitive pixel 111 with regard to shape, size and position. The micro-lens 151 converges light onto a photosensitive part 112 of the photosensitive pixel 111, thereby enhancing the photosensitivity of the photosensitive pixels 111 to improve the quality of the image. In some embodiments, each filter unit 1315 corresponds to 2*2 photosensitive pixels 111 and 2*2 micro-lenses 151.

Figure 5:
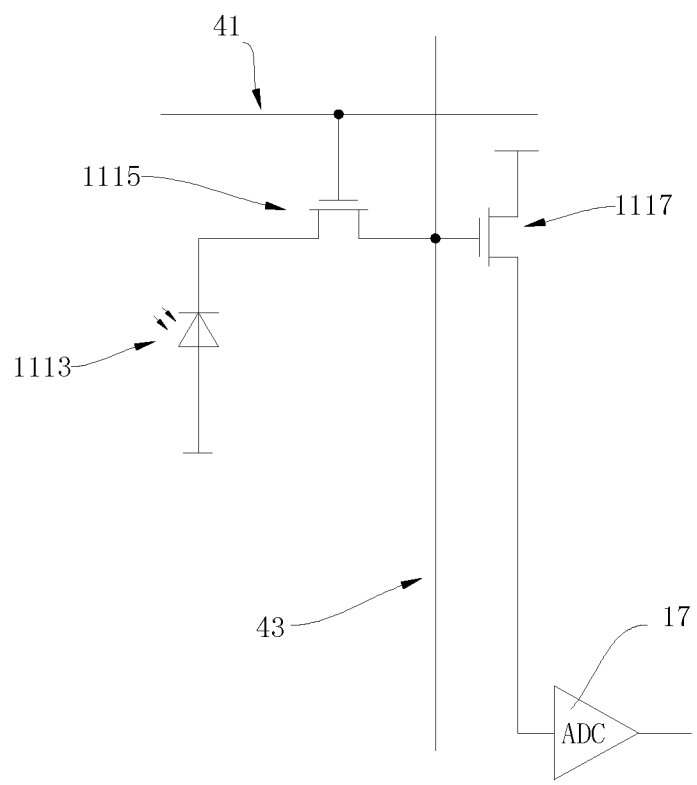
FIG. 5 is a schematic diagram illustrating a photosensitive pixel and a related circuit according to an embodiment of the present disclosure.

Referring to FIG. 5, FIG. 5 is a schematic diagram illustrating a photographic pixel and a related circuit. In an embodiment of the present disclosure, the photosensitive pixel 111 includes a photodiode 1113. The connection relationships between the photosensitive pixel 111 and the switching tube 1115, the source follower 1117 and the analog-to-digital converter 17 are illustrated in FIG. 5. That is, one photoreceptor pixel 111 corresponds to one source follower 1117 and one analog-to-digital converter 17.

The photodiode 1113 is configured to convert light into electric charge. The generated electric charge is proportional to intensity of the light. The switching tube 1115 is configured to control the circuit to turn on or off according to the control signals of the row selection logic unit 41 and the column selection logic unit 43. When the circuit is turned on, the source follower 1117 is configured to convert the charge signal generated by the photodiode 1113 from light illumination into a voltage signal. The analog-to-digital converter 17 is configured to convert the voltage signal into a digital signal and to transmit the digital signal to the image processing module 20 for processing. The row selection logic unit 41 and the column selection logic unit 43 are connected to a control module (not illustrated in the drawings) of the imaging apparatus 100 and are controlled by the control module of the imaging apparatus 100.

With the imaging apparatus according to an embodiment of the present disclosure, the image processing module can obtain an HDR image effect by synthetically as long as one frame outputted from the image sensor is obtained, thereby greatly reducing the time period for waiting for data frames during the multi-frame synthesis; moreover, since the data for the multi-frame synthesis comes from the same frame of the image sensor, the ghosting effect may be avoided, and thus greatly enhancing the user experience.

In order to realize the above embodiments, the present disclosure also provides an electronic device. The electronic device includes the imaging apparatus of embodiments of the present disclosure.

With the electronic device according to an embodiment of the present disclosure, since the imaging apparatus is provided, when taking photos, an HDR image effect can be obtained by synthesis as long as there is one frame outputted from the image sensor, thereby greatly reducing the time period for waiting for data frames during the multi-frame synthesis. In addition, since the data for the multi-frame synthesis comes from the same frame of the image sensor, the ghosting effect may be avoided, and thus greatly enhancing the user experience.

In order to realize the above embodiments, the present disclosure also provides a mobile terminal.

Figure 6:
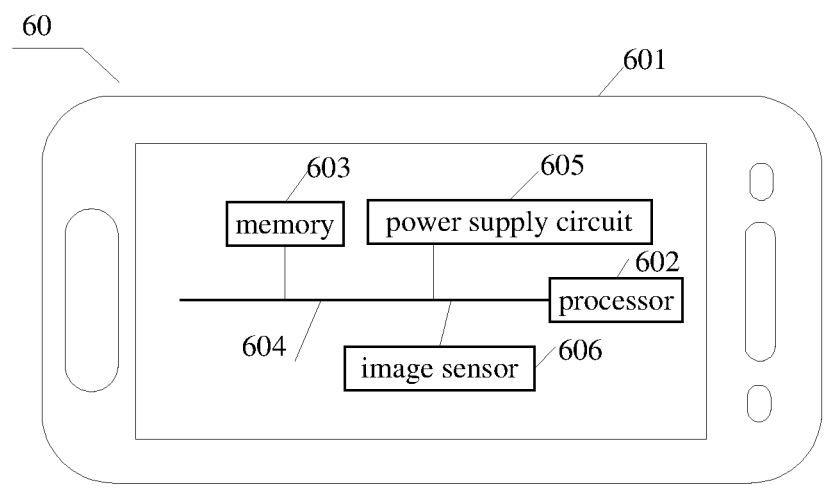
FIG. 6 is a block diagram of a mobile terminal according to an embodiment of the present disclosure.

Referring to FIG. 6, FIG. 6 is a block diagram of a mobile terminal according to an embodiment of the present disclosure.

As illustrated in FIG. 6, the mobile terminal 60 according to an embodiment of the present disclosure includes a housing 601, a processor 602, a memory 603, a circuit board 604, a power supply circuit 605 and an image sensor 606. The circuit board 604 is located in a space defined by the housing 601. The processor 602, the memory 603 and the image sensor 606 are arranged on the circuit board 604. The power supply circuit 605 is configured to supply power for each circuit or component in the mobile terminal 60. The image sensor 606 includes a photosensitive pixel array and a filter disposed on the photosensitive pixel array. The filter includes an array of filter units. Each filter unit and a plurality of adjacent photosensitive pixels covered by the filter unit in the photosensitive pixel array form a synthesized pixel. The memory 603 is configured to store executable program codes. The processor 602 is configured to execute a program corresponding to the executable program codes by reading the executable program codes stored in the memory 603 so as to perform acts of:

reading an output of the photosensitive pixel array, extracting pixel values of photosensitive pixels within different synthesized pixels from a read-out single-frame high-resolution image, and combining the pixel values so as to obtain a plurality of multiple-frame low-resolution images; and synthesizing the plurality of multiple-frame low-resolution images.

It should be noted that, the foregoing explanation of the imaging method for an image sensor according to embodiments is also applicable to the mobile terminal in this embodiment, and the implementation thereof are similar in principle and will not be described here.

With the mobile terminal of embodiments of the present disclosure, the processor is configured to execute the program corresponding to the executable program codes by reading the executable program codes stored in the memory so as to perform acts of: reading output of the photosensitive pixel array, extracting pixel values of photosensitive pixels within different synthesized pixels from a read-out single-frame high-resolution image and combining the pixel values so as to obtain a plurality of multiple-frame low-resolution images; synthesizing the plurality of multiple-frame low-resolution images. Therefore, an HDR image can be obtained by synthesis while only one frame output from the image sensor is needed, thereby greatly reducing the time period for waiting for data frames during the multi-frame synthesis; moreover, since the data for the multi-frame synthesis comes from the same frame of the image sensor, the generation of ghosting may be avoided, and thus greatly enhancing the user experience.

In order to realize the above embodiments, the present disclosure also provides a non-transitory computer-readable storage medium having stored therein one or more programs. When the one or more programs are performed by a device, the device is caused to perform the imaging method for an image sensor according to the first aspect of embodiments of the present disclosure.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

The flow chart or any process or method described herein in other manners may represent a module, segment, or portion of code that comprises one or more executable instructions to implement the specified logic function(s) or that comprises one or more executable instructions of the steps of the progress. Although the flow chart shows a specific order of execution, it is understood that the order of execution may differ from that which is depicted. For example, the order of execution of two or more boxes may be scrambled relative to the order shown.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc. Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An imaging method for an image sensor, wherein the image sensor comprises a photosensitive pixel array and a filter arranged on the photosensitive pixel array, the filter comprises an array of filter units, each filter unit and 2*2 adjacent photosensitive pixels covered by the filter unit in the photosensitive pixel array form a synthesized pixel, four adjacent synthesized pixels corporately form a synthesized pixel unit, and four filter units arranged adjacently within each synthesized pixel unit comprise a red filter unit, a blue filter unit and two green filter units, each photosensitive pixel comprises a photodiode, one photosensitive pixel corresponds to one source follower and one analog-to-digital converter, and the method comprising:

reading an output of the photosensitive pixel array, and extracting pixel values of photosensitive pixels located at same positions or different locations in four adjacent synthesized pixels of the synthesized pixel unit from a read-out single-frame high-resolution image, and combining the pixel values so as to obtain four frames of low-resolution images; and synthesizing the four frames of low-resolution images.

2. An imaging apparatus, comprising:

an image sensor, comprising:
- a photosensitive pixel array;
- a filter arranged on the photosensitive pixel array, wherein the filter comprises an array of filter units, each filter unit and 2*2 adjacent photosensitive pixels covered by the filter unit in the photosensitive pixel array form a synthesized pixel, four adjacent synthesized pixels corporately form a synthesized pixel unit, and four filter units arranged adjacently within each synthesized pixel unit comprise a red filter unit, a blue filter unit and two green filter units, each photosensitive pixel comprises a photodiode, one photosensitive pixel corresponds to one source follower and one analog-to-digital converter;

and an image processing module, connected to the image sensor, configured to read an output of the photosensitive pixel array, and to extract pixel values of photosensitive pixels located at same positions or different locations in four adjacent synthesized pixels of the synthesized pixel unit from a read-out single-frame high-resolution image, and to combine the pixel values so as to obtain four frames of low-resolution images and to synthesize the four frames of low-resolution images.

3. The imaging apparatus according to claim 2, wherein each synthesized pixel further comprises a lens array arranged above the filter unit, and the lens array converges light onto the photosensitive pixels beneath the filter.

4. The imaging apparatus according to claim 3, wherein the lens array comprises a plurality of micro-lenses and each micro-lens is arranged corresponding to one photosensitive pixel.

5. An electronic device, comprises an imaging apparatus, wherein the imaging apparatus comprises:
an image sensor, comprising:
- a photosensitive pixel array;
- a filter arranged on the photosensitive pixel array, wherein the filter comprises an array of filter units, each filter unit and 2*2 adjacent photosensitive pixels covered by the filter unit in the photosensitive pixel array form a synthesized pixel, four adjacent synthesized pixels corporately form a synthesized pixel unit, and four filter units arranged adjacently within each synthesized pixel unit comprise a red filter unit, a blue filter unit and two green filter units, each photosensitive pixel comprises a photodiode, one photosensitive pixel corresponds to one source follower and one analog-to-digital converter;

and an image processing module, connected to the image sensor, configured to read an output of the photosensitive pixel array, and to extract pixel values of photosensitive pixels located at same positions or different locations in four adjacent synthesized pixels of the synthesized pixel unit from a read-out single-frame high-resolution image, and to combine the pixel values so as to obtain four frames of low-resolution images and to synthesize the four frames of low-resolution images.

6. The electronic device according to claim 5, wherein each synthesized pixel further comprises a lens array arranged above the filter unit, and the lens array converges light onto the photosensitive pixels beneath the filter.

7. The electronic device according to claim 6, wherein the lens array comprises a plurality of micro-lenses and each micro-lens is arranged corresponding to one photosensitive pixel.

* * * * *